United States Patent
Colahan et al.

(10) Patent No.: US 9,272,471 B2
(45) Date of Patent: Mar. 1, 2016

(54) SWITCH MODULES WITH ELECTROMAGNETIC INTERFERENCE SHIELDING STRUCTURES

(71) Applicant: Apple Inc., Cupertino, CA (US)

(72) Inventors: Ian P. Colahan, Menlo Park, CA (US); Kurt R. Stiehl, San Jose, CA (US)

(73) Assignee: Apple Inc., Cupertino, CA (US)

( * ) Notice: Subject to any disclaimer, the term of this patent is extended or adjusted under 35 U.S.C. 154(b) by 514 days.

(21) Appl. No.: 13/864,505

(22) Filed: Apr. 17, 2013

(65) Prior Publication Data

US 2014/0313688 A1    Oct. 23, 2014

(51) Int. Cl.

| H05K 9/00 | (2006.01) |
|---|---|
| B29C 70/88 | (2006.01) |
| B29C 45/16 | (2006.01) |
| H01H 13/00 | (2006.01) |
| H04R 1/10 | (2006.01) |
| B29C 45/14 | (2006.01) |
| H04R 5/033 | (2006.01) |

(52) U.S. Cl.
CPC ........... *B29C 70/882* (2013.01); *B29C 45/1671* (2013.01); *H01H 13/00* (2013.01); *H04R 1/1041* (2013.01); *H05K 9/0043* (2013.01); *H05K 9/0045* (2013.01); *B29C 45/14639* (2013.01); *B29K 2995/0005* (2013.01); *B29K 2995/0007* (2013.01); *H04R 5/033* (2013.01)

(58) Field of Classification Search
CPC .................................. G06F 1/182; H05K 9/00
USPC ........................................................ 361/818
See application file for complete search history.

(56) References Cited

U.S. PATENT DOCUMENTS

| 4,814,566 | A  * | 3/1989 | Sigl ............................... 200/305 |
|---|---|---|---|
| 6,870,091 | B2 * | 3/2005 | Seidler ......................... 174/382 |
| 7,221,768 | B2   | 5/2007 | Sjursen et al. |
| 8,094,464 | B2   | 1/2012 | Choi |
| 8,180,093 | B2   | 5/2012 | Hankey et al. |

(Continued)

FOREIGN PATENT DOCUMENTS

EP    2447971    5/2012

OTHER PUBLICATIONS

Michaeli et al., "5 Highly Conductive Plastics-Custom-Formulated Functional Materials for Injection Mouldable Electronic Applications".

*Primary Examiner* — Forrest M Phillips
(74) *Attorney, Agent, or Firm* — Treyz Law Group, P.C.; Kendall P. Woodruff

(57) ABSTRACT

An accessory may be provided with a button controller having a microphone and switches. The switches may include dome switch members and metal switch terminals mounted in a switch module housing structure. The switch module housing structure may include one or more recesses in which electrical components are mounted. A conductive backplate may cover the recesses and may be coupled to the switch module housing structure. A conductive film may be attached to the switch module housing structure over the dome switch members. The conductive film and the conductive backplate may form an electromagnetic interference shield around the electrical components in the recesses. The switch module housing structure may include a non-conductive plastic overmolded onto a metal frame or may be formed from a first shot of non-conductive plastic and a second shot of conductive plastic to form an electromagnetic interference shield for the electrical components.

18 Claims, 12 Drawing Sheets

(56) References Cited

U.S. PATENT DOCUMENTS

| | | | |
|---|---|---|---|
| 2009/0129043 A1* | 5/2009 | Oh et al. | 361/818 |
| 2009/0147493 A1* | 6/2009 | Wu | 361/818 |
| 2009/0175020 A1* | 7/2009 | Zadesky | 361/818 |
| 2012/0111712 A1* | 5/2012 | Cour et al. | 200/511 |
| 2012/0177229 A1 | 7/2012 | Lorenz et al. | |
| 2013/0313097 A1* | 11/2013 | Yabe et al. | 200/520 |

* cited by examiner

SWITCH MODULES WITH ELECTROMAGNETIC INTERFERENCE SHIELDING STRUCTURES

BACKGROUND

This relates to electronic devices, and more particularly, to accessories for electronic devices.

Electronic devices such as computers, media players, and cellular telephones typically contain user interface components that allow these devices to be controlled by a user. It is sometimes desirable to add accessories to electronic devices. For example, a user may desire to plug a headset or adapter accessory into an electronic device to allow the user to listen to audio.

Headsets are sometimes provided with buttons and microphones. A headset microphone may be used to pick up a user's voice during a telephone call. Buttons may be used to control media file playback, to make volume level adjustments during a telephone call, and to issue other commands for the electronic device. Buttons and a microphone may be mounted within a button controller assembly. Microphone signals and button signals may be routed from the button controller assembly to an electronic device using wires in the headset.

The designers of accessories and other electronic equipment are challenged with designing parts that are not overly complex or costly and that exhibit satisfactory reliability and performance. For example, it can be challenging to design a button controller assembly that adequately shields electrical components within the button controller assembly from electromagnetic interference without adding undesirable bulkiness to the button controller assembly.

It would therefore be desirable to provide improved electronic device accessories such as accessories with button controller and microphone assemblies.

SUMMARY

An accessory may be provided with a button controller. The button controller may have a switch module that contains switches and electrical components such as a microphone. The switches may be formed from dome switch members and metal switch terminals. The microphone and other electrical components may be mounted in recesses in switch module housing structures.

The switch module housing structures may be formed using injection molding operations. For example, switch terminals for the switches may be formed by molding plastic around switch terminal structures. Switches may then be formed using dome switch members and the switch terminals. The switch module housing structures may be mounted to a conductive backplate.

A conductive thin film may be attached to the switch module housing structure over the dome switch members. The conductive film and conductive backplate may form an electromagnetic interference shield that surrounds the electrical components in the button controller.

In another suitable embodiment, the switch module housing structure may be formed from a first shot of non-conductive plastic and a second shot of conductive plastic. The conductive plastic and a conductive backplate may form an electromagnetic interference shield around the electrical components in the button controller.

In another suitable embodiment, the switch module housing structure may be formed from a shot of non-conductive plastic that is insert molded around the metal switch terminals and a metal frame. The metal frame and a conductive backplate may form an electromagnetic interference shield around the electrical components in the button controller.

In another suitable embodiment, a conductive enclosure may have interior and exterior surfaces. A printed circuit on which an electrical component is mounted may be mounted to the interior surface of the conductive enclosure. A switch module may be mounted to the exterior surface of the conductive enclosure and may include metal switch terminals that are electrically coupled to the printed circuit through the conductive enclosure. The conductive enclosure may include a U-shaped metal structure that is welded to a planar sheet of metal.

Further features, their nature, and various advantages will be more apparent from the accompanying drawings and the following detailed description of the preferred embodiments.

DETAILED DESCRIPTION

Electronic components such as microphones and buttons may be used in a wide range of applications. For example, microphones and buttons may be used to form a button controller for a headset or other accessory. Button structures and microphone structures may, in general, be used in any suitable system. Button controller assemblies that are suitable for use in accessories such as electronic device headsets are sometimes described herein as an example.

Figure 1:
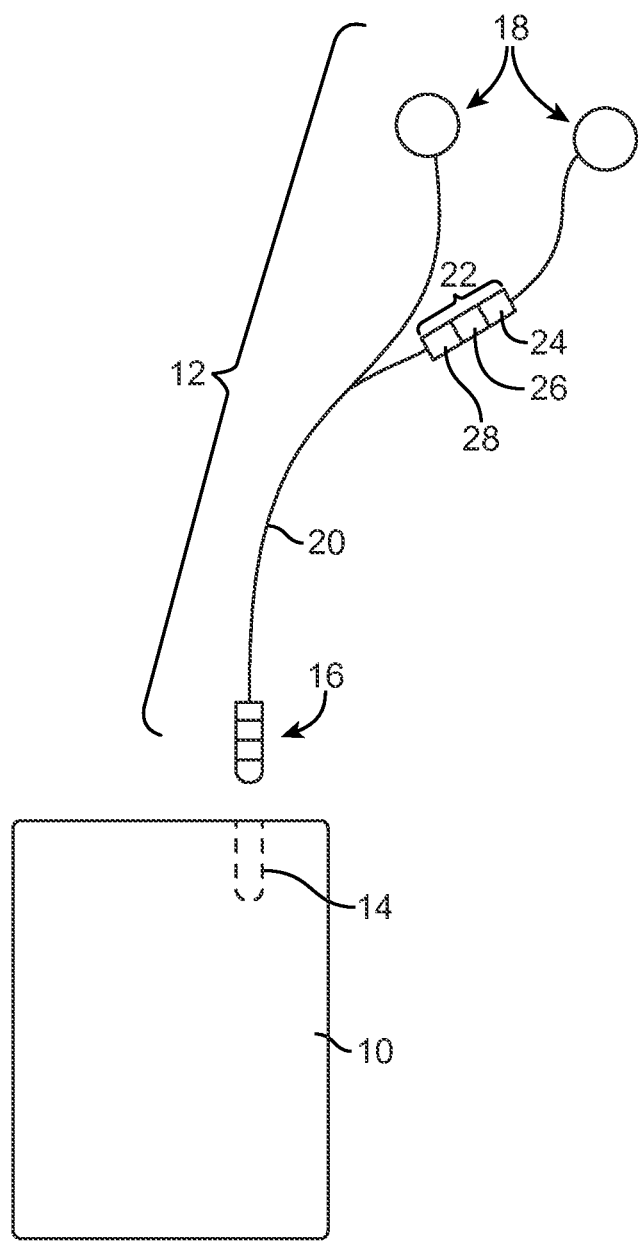
FIG. 1 is a diagram of a system including an electronic device and associated accessory in accordance with an embodiment.

An illustrative system in which an accessory may be used with an electronic device is shown in FIG. 1. As shown in FIG. 1, electronic device 10 may be coupled to an accessory such as headset 12 by plugging plug 16 of accessory 12 into jack 14 of electronic device 10.

Electronic device 10 may be a computer such as a desktop computer, tablet computer, or laptop computer. Device 10 may also be a handheld electronic device such as a cellular telephone or media player, a tablet device, other portable electronic devices, or any other electronic equipment. Headset 12 may have speakers 18 and controller 22. Controller 22 may have buttons and may therefore sometimes be referred to as a button controller or button controller assembly. Button controller 22 and speakers 18 may be coupled to device 10 using cable 20 (e.g., a three-wire or four-wire headset cable). Button controller 22 may, if desired, include one or more microphones. For example, button controller 22 may include a voice microphone that is used by a user of device 10 and headset 12 during a telephone call (e.g., to pick up the user's voice).

Button controller 22 may include buttons such as buttons 24, 26, and 28. There may, in general, be any suitable number of buttons in button controller 22 (e.g., one or more buttons, two or more buttons, three or more buttons, etc.). With one suitable arrangement, which is sometimes described herein as an example, button controller 22 may include three buttons. These buttons may be used to issue commands for device 10. Examples of commands that may be issued for device 10 using the buttons of button controller assembly 22 include stop, forward, and reverse commands, volume up and down commands, telephone call control commands, etc.

Figure 2:
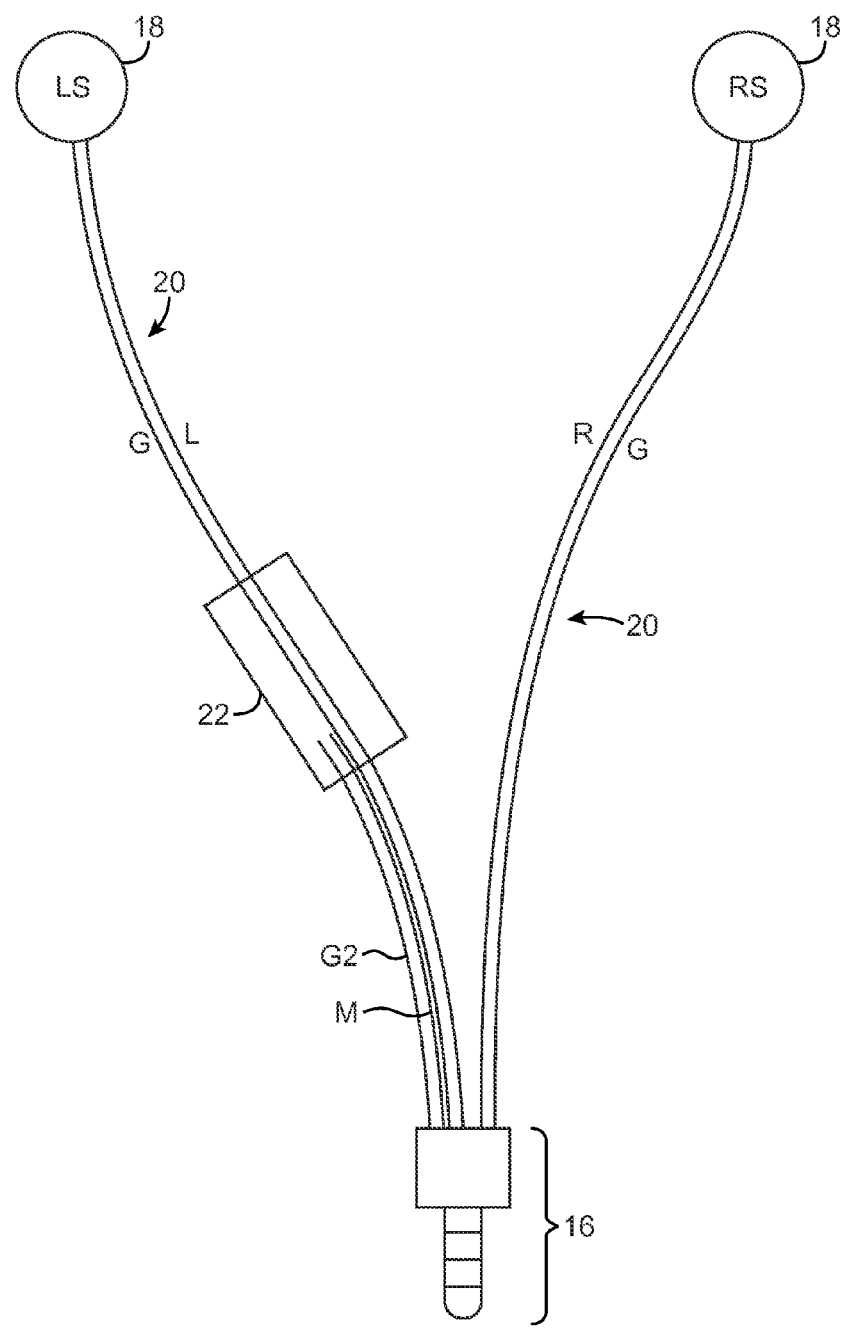
FIG. 2 is a wiring diagram for an illustrative accessory such as a pair of headphones with a button controller that has switches and a microphone in accordance with an embodiment.

A wiring diagram of an illustrative accessory such as headset 12 of FIG. 1 is shown in FIG. 2. As shown in FIG. 2, headset 12 may have wires in cables 20 that interconnect left speaker 18 (LS), right speaker 18 (RS), plug 16, and button controller 22. Two ground lines (G and G2) may be coupled to a ground terminal in plug 16. A microphone line (M), left speaker line (L), and right speaker line (R) may be coupled to a microphone terminal, left speaker terminal, and right speaker terminal in plug 16, respectively. Ground line G2 and microphone line M may terminate on terminals in button controller 22. Ground line G and speaker line L may pass through the housing of button controller 22 to couple to speaker terminals in left speaker LS. Right speaker RS may have terminals that are coupled between right speaker line R and ground speaker line G.

The configuration of FIG. 2 in which button controller 22 is located on cable 20 between left speaker 18 and plug 16 is merely illustrative. If desired, button controller 22 may be located on cable 20 between right speaker 18 and plug 16.

Figure 3:
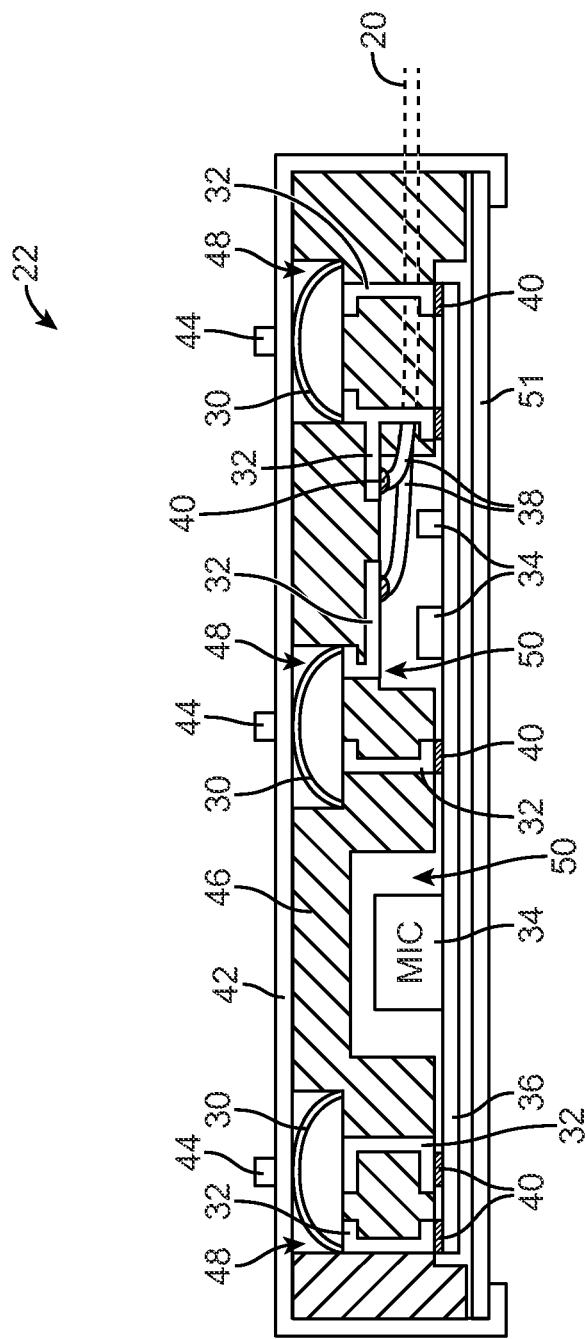
FIG. 3 is a cross-sectional side view of an illustrative button controller assembly for an accessory in accordance with an embodiment of the present invention.

A cross-sectional side view of structures in button controller 22 is shown in FIG. 3. As shown in FIG. 3, button controller 22 may have a dome switches formed from dome switch members such as dome switch members 30. Each dome switch member may contact portions of terminal structures such a terminal structures 32. Terminal structures 32 may be formed from metal and may be soldered to circuitry such as components 34 on printed circuit board 36 and to wires such as wires 38 in cable 20 using solder 40. Dome switch members 30 may be received within recesses 48 in switch module housing structure 46. During operation, dome switch members 30 may be compressed by a user. When a dome switch member is compressed in this way, metal on the dome switch member can short together a corresponding pair of switch terminal structures (i.e., each dome switch is formed from a corresponding dome switch member 30 and portions of associated terminals structures 32).

Flexible sheet 42 may cover dome switch members 30. Flexible sheet 42 may be used to hold dome switch members 30 in place while also providing a barrier structure for preventing moisture and other environmental contaminants from entering button controller 22. Structures 44 may be formed from a material such as epoxy and may be used to create a structure against which an overlying plastic button member may bear when actuating the switches formed by dome switch members 30. Housing structure 46 may have upper recesses such as dome switch member recesses 48 for receiving dome switch members 30 and may have lower recesses such as lower recesses 50 for receiving components such as a microphone (MIC) and other electrical components 34 on printed circuit board 36. A planar member such as a sheet of plastic or metal such as backplate 51 may be used to cover recesses such as recesses 50 on the rear of structures 46.

Components such as components 34 on printed circuit 36 may include one or more noise cancelling microphones. For example, a voice microphone in button controller 22 may have an associated noise cancellation microphone that picks up ambient noise in the vicinity of the voice microphone. The earbuds or other speakers in an accessory may also have noise cancellation microphones. For example, left and right speakers 18 of FIG. 2 may each have an external noise cancellation microphone on an outer surface of the speaker. In addition to the external noise cancellation microphone or instead of the external noise cancellation microphone, each speaker 18 may have an internal noise cancellation microphone on an interior surface of the speaker (adjacent to the ear).

Components 34 on printed circuit 36 may include digital audio processing circuitry for performing digital signal processing on audio signals. For example, an audio signal processor in button controller 22 may be used to remove noise from the audio voice signal picked up by voice microphones in button controller 22. Electrical paths in cable 20 may be used in conveying digital audio data between accessory 12 and electronic device 10 (e.g., pulse-code-modulation encoded digital audio data).

Care must be taken to ensure that digital signal processing circuitry is properly shielded from electromagnetic interference. Without adequate electromagnetic shielding, radiated emissions from integrated circuits within accessory 12, radiated emissions from outside sources, and/or electrostatic discharge can interfere with and disrupt signal processing.

Electromagnetic shielding structures may be incorporated into button controller 22. The electromagnetic shielding structures may fully or partially surround components 34 on printed circuit 36. The electromagnetic shielding structures may, for example, be incorporated into housing structure 46 and/or may be incorporated into flexible sheet 42. Incorporating electromagnetic shielding structures into the structures that make up button controller 22 may eliminate the need for separate shielding structures that would add undesirable bulkiness to button controller 22.

In the illustrative example of FIG. 3, flexible sheet 42 is formed from a conductive film that wraps around switch module housing structure 46 and is coupled to backplate 51. Backplate 51 may also be conductive (e.g., backplate 51 maybe formed from metal or conductive plastic) and may be used to electrically ground conductive film 42. Conductive film 42 and conductive backplate 51 together form an electromagnetic shield that completely surrounds components 34 on printed circuit 36.

Conductive film 42 may, for example, be a metalized thin film formed from a layer of metal that is laminated to a polymer substrate, a layer of metal that is taped to a polymer substrate using adhesive, a metal coating that is sputtered or deposited onto a polymer substrate, a layer of metal that is heat bonded to a polymer substrate (e.g., using a heat press), and/or may include other conductive materials or structures. If desired, other suitable fabrication processes may be used to form conductive film 42.

Conductive film 42 may be flexible such that, when a user presses an overlying plastic button member above structure 44, structure 44 deforms flexible conductive film 42, which in turn deforms dome switch members 30 and actuates the switches formed by dome switch members 30. Conductive film 42 may also form a barrier structure that moisture-seals button controller 22 and prevents other environmental contaminants from entering button controller 22.

Multiple injection-molded plastic structures (sometimes referred to as "shots" of plastic) may be used in forming button controller structures. For example, housing structure 46 may be formed using first and second shots of plastic. The first shot of plastic may be injected around terminal structures 32 and may be used to electrically insulate terminal structures 32 from each other. The second shot of plastic may be overmolded onto the first shot of plastic and may be used to cover any exposed portions of terminal structures 32. The first and second shots of plastic may together form switch module housing structure 46.

In the illustrative example of FIG. 3, components 34 are electromagnetically shielded by conductive film 42 and backplate 51. With this type of configuration, housing structures 46 need not include any conductive materials for shielding components 34. Housing structures 46 may, for example, be formed from non-conductive plastics such as liquid crystal polymers, thermoplastic synthetic resins such as polyamide, glass-filled polymers, other non-conductive plastics, or a combination of any two or more of these non-conductive materials.

Figure 4:
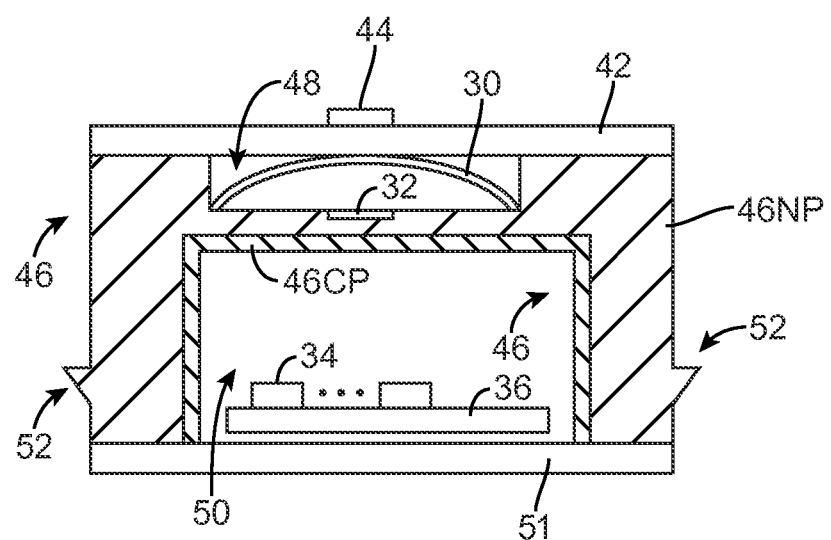
FIG. 4 is a cross-sectional side view of illustrative button controller structures in which a switch module housing structure is formed from a first shot of non-conductive plastic and a second shot of conductive plastic in accordance with an embodiment.

In another suitable embodiment, electromagnetic shielding structures may be incorporated into housing structures 46. This type of configuration is shown in FIG. 4. As shown in FIG. 4, housing structures 46 include a non-conductive portion such as non-conductive housing structure 46NP and a conductive housing structure such as conductive housing structure 46CP. Non-conductive housing structure 46NP may be formed from a non-conductive plastic such as liquid crystal polymer, thermoplastic synthetic resin such as polyamide, glass-filled polymer, and/or other non-conductive plastic. Conductive housing structure 46CP may be formed from a conductive plastic such as a polymer with a conductive filler (e.g., carbon black filler, metallic fibers, etc.).

Housing structures 46 may, for example, be formed from a two-shot injection molding process. A first shot of non-conductive resin may be injected around electrical terminals 32 and may be used in forming non-conductive housing portion 46NP. A second shot of conductive resin may be overmolded onto non-conductive housing structure 46NP and may be used in forming conductive housing structure 46CP. As shown in FIG. 4, conductive plastic 46CP forms a conductive lining that surrounds recess 50 in plastic structure 46NP.

Non-conductive housing structure 46NP may be formed with engagement structures such as engagement structures 52 (sometimes referred to as snap features). Engagement structures 52 may be used in mounting switch module housing structure 46 in a button controller housing. For example, engagement structures 52 may snap into place within a button controller housing and may hold switch module housing structure 46 and other switch module structures in place within the button controller housing.

As shown in FIG. 4, conductive housing structure 46CP is formed on an interior surface of non-conductive portion 46NP and partially surrounds components 34 on printed circuit 36. Conductive housing structure 46CP is coupled to and electrically grounded by backplate 51. Conductive housing structure 46CP may be laser welded to backplate 51, may be coupled to backplate 51 using a conductive adhesive, or may otherwise be electrically coupled to backplate 51. Backplate 51 may be formed from a conductive material such as metal or conductive plastic. With this type of configuration, injection-molded conductive plastic housing structure 46CP and conductive backplate 51 together form an electromagnetic shield that completely surrounds components 34 on printed circuit 36.

Because components 34 are adequately shielded from electromagnetic interference by conductive plastic housing structure 46CP and backplate 51, flexible film 42 need not be conductive. Flexible film 42 may be formed from a non-conductive polymer such as polyethylene terephthalate (PET) or other suitable non-conductive flexible films. The non-conductive polymer film may be used to hold dome switch members 30 in place while also providing a barrier structure for preventing moisture and other environmental contaminants from entering button controller 22. This is, however, merely illustrative. If desired, flexible film 42 may be formed from a conductive material.

Figure 5:
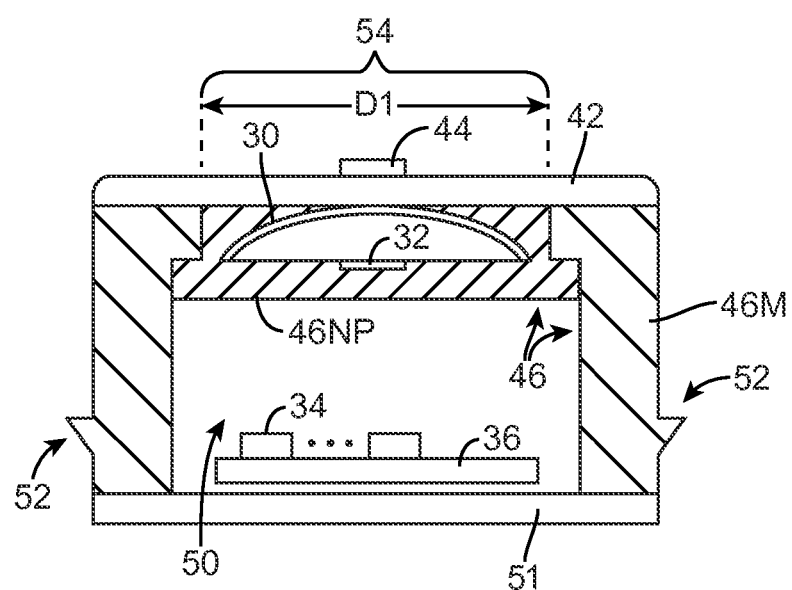
FIG. 5 is a cross-sectional side view of illustrative button controller structures in which a switch module housing structure is formed from a shot of non-conductive plastic that is overmolded onto a metal frame having engagement features in accordance with an embodiment.

In another suitable embodiment, electromagnetic shielding structures are incorporated into switch module housing structure 46 using a metal frame structure. This type of configuration is shown in FIG. 5. As shown in FIG. 5, housing structure 46 includes non-conductive plastic housing structure 46NP and metal frame structure 46M. Non-conductive housing structure 46NP may be formed from a non-conductive plastic such as liquid crystal polymer, thermoplastic synthetic resin such as polyamide, glass-filled polymer, and/or other non-conductive plastic. Metal frame structure 46M (sometimes referred to as a metal housing structure) may be formed from metal material such as sheet metal or other metal material. Metal frame 46M may include engagement features 52 for mounting switch module housing 46 and other switch module structures into a button controller housing for button controller 22. If desired, engagement features 52 may be metal snap structures that are laser welded onto metal housing portion 46M.

Housing structure 46 may, for example, be formed using an insert-molding process in which non-conductive molten plastic 46NP is injected into a mold that includes electrical terminals 32 and metal frame structure 46M. In other words, non-conductive plastic housing structure 46NP may be insert-molded around electrical terminals 32 and metal frame 46M.

As shown in FIG. 5, metal frame 46M partially surrounds components 34 on printed circuit 36. Metal frame 46M is coupled to and electrically grounded by backplate 51. Metal frame 46M may be laser welded to backplate 51, may be coupled to backplate 51 using a conductive adhesive, or may otherwise be electrically coupled to backplate 51. Backplate 51 may be formed from a conductive material such as metal or conductive plastic. With this type of configuration, metal frame 46M and conductive backplate 51 together form an electromagnetic shield that substantially surrounds components 34 on printed circuit 36.

As shown in FIG. 5, the electromagnetic shield formed by metal frame 46M and backplate 51 may include a gap such as gap 54 having a diameter D1. Diameter D1 of opening 54 in the electromagnetic shield (sometimes referred to as an aperture) may be sufficiently small such that components 34 are adequately shielded from electromagnetic interference. In this type of scenario, flexible film 42 need not be formed from conductive material. Flexible film 42 may instead be formed from a non-conductive flexible polymer such as PET (as an example).

This is, however, merely illustrative. If desired, flexible film 42 may be formed from conductive material and may form an electromagnetic interference shield that covers gap 54. With this type of configuration, metal frame 46M, conductive backplate 51, and flexible conductive film 42 may together form an electromagnetic shield that completely surrounds components 34. Conductive film 42 may be grounded via metal frame 46M and conductive backplate 51.

Figure 6:
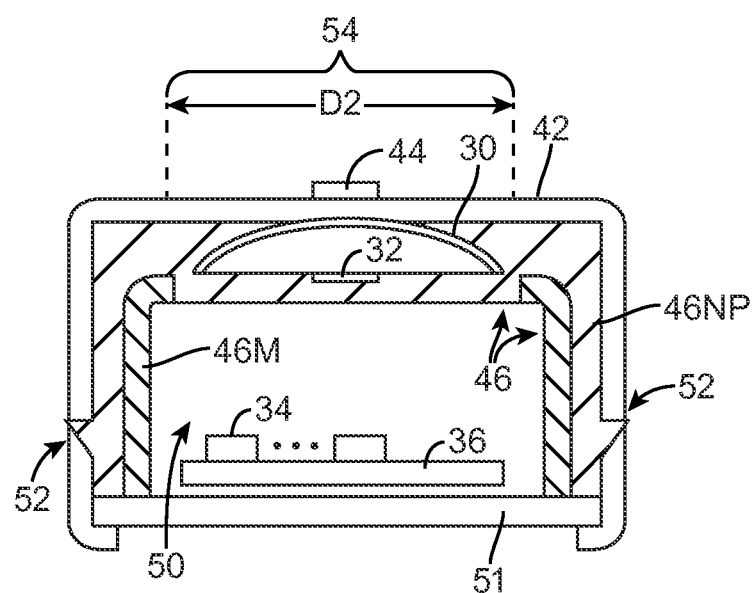
FIG. 6 is a cross-sectional side view of illustrative button controller structures in which a switch module housing structure is formed from a shot of non-conductive plastic having engagement features that is overmolded onto a metal frame in accordance with an embodiment.

The configuration of FIG. 5 in which metal structure 46M forms an exterior surface of housing structure 46 and includes engagement features 52 is merely illustrative. If desired, non-conductive housing structure 46NP may form an exterior surface for housing structure 46 and may include engagement features 52. This type of configuration is shown in FIG. 6. As shown in FIG. 6, housing structure 46 includes non-conductive plastic housing structure 46NP and metal frame structure 46M. Non-conductive housing structure 46NP may be formed from a non-conductive plastic such as liquid crystal polymer, thermoplastic synthetic resin such as polyamide, glass-filled polymer, and/or other non-conductive plastic. Metal frame 46M may be formed from metal material such as sheet metal or other metal material. Non-conductive housing structure 46NP may be molded to include engagement features 52 for mounting switch module housing 46 and other switch module structures into a button controller housing for button controller 22.

Housing structure 46 may, for example, be formed using an insert-molding process in which non-conductive molten plastic 46NP is injected into a mold that includes electrical terminals 32 and metal frame structure 46M. In other words, non-conductive plastic housing structure 46NP may be insert-molded around electrical terminals 32 and metal frame 46M.

As shown in FIG. 6, metal frame 46M partially surrounds components 34 on printed circuit 36. Metal frame 46M is coupled to and electrically grounded by backplate 51. Metal frame 46M may be laser welded to backplate 51, may be coupled to backplate 51 using a conductive adhesive, or may otherwise be electrically coupled to backplate 51. Backplate 51 may be formed from a conductive material such as metal or conductive plastic. With this type of configuration, metal frame 46M and conductive backplate 51 together form an electromagnetic shield that substantially surrounds components 34 on printed circuit 36.

As shown in FIG. 6, the electromagnetic shield formed by metal frame 46M and backplate 51 may include a gap such as gap 54 having a diameter D2. Diameter D2 of gap 54 in the electromagnetic shield may be sufficiently small such that components 34 are adequately shielded from electromagnetic interference. In this type of scenario, flexible film 42 need not be formed from conductive material. Flexible film 42 may instead be formed from a non-conductive flexible polymer such as PET (as an example). In configurations where flexible film 42 is formed from a non-conductive material, flexible film 42 need not wrap all the way around housing structure 46 to couple to backplate 51.

This is, however, merely illustrative. If desired, flexible film 42 may be formed from conductive material and may form an electromagnetic interference shield that covers gap 54. With this type of configuration, metal frame 46M, conductive backplate 51, and flexible conductive film 42 may together form an electromagnetic interference shield that completely surrounds components 34. Conductive film 42 may wrap around housing structures 46 and may be coupled to and electrically grounded by conductive backplate 51. If desired, openings may be formed in flexible film 42 over engagement features 52 so that engagement features 52 are exposed and able to snap into place within the button controller housing for button controller 22.

Figure 7:
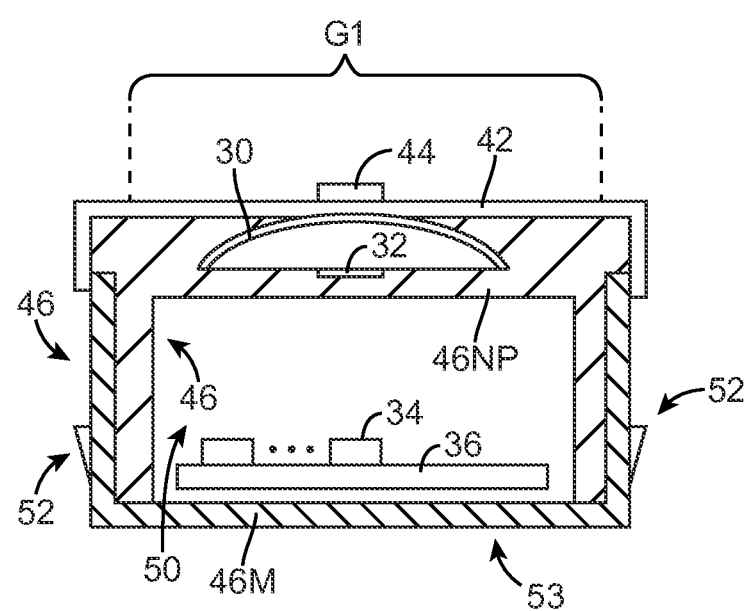
FIG. 7 is a cross-sectional side view of illustrative button controller structures in which a switch module housing structure is formed from a shot of non-conductive plastic and a U-shaped metal frame having engagement features in accordance with an embodiment.

In another suitable embodiment, electromagnetic shielding structures that are incorporated into housing structure 46 may include a U-shaped metal frame structure. This type of configuration is shown in FIG. 7. As shown in FIG. 7, housing structure 46 includes non-conductive plastic housing structure 46NP and metal structure 46M. Non-conductive housing structure 46NP may be formed from a non-conductive plastic such as liquid crystal polymer, thermoplastic synthetic resin such as polyamide, glass-filled polymer, and/or other non-conductive plastic. Metal frame 46M may be formed from metal material such as sheet metal or other metal material. Engagement features 52 such as metal snap structures 52 may be mounted to the exterior surface of metal frame 46M (e.g., metal snap structures 52 may be laser welded onto the surface of metal frame 46M).

Non-conductive housing structure 46NP may, for example, be formed using an insert-molding process in which non-conductive molten plastic 46NP is injected into a mold that includes electrical terminals 32. In other words, non-conductive plastic housing structure 46NP may be insert-molded around electrical terminals 32.

Following insert-molding non-conductive housing portion 46NP, non-conductive housing portion 46NP may be assembled with U-shaped metal frame 46M to form switch module housing structure 46. As shown in FIG. 7, U-shaped metal frame 46M partially surrounds components 34 on printed circuit 36. The electromagnetic shield formed by metal frame 46M may include a gap such as gap G1. Flexible film 42 may be formed from a conductive material and may be formed over an upper surface of housing structure 46 to cover gap G1. Flexible film 42 is formed on the surface of non-conductive housing structure 46NP and wraps around housing structure 46 to couple to metal frame 46M. Flexible conductive film 42 and metal frame 46M together form an electromagnetic shield that completely surrounds components 34 on printed circuit 36.

With the configuration shown in FIG. 7, an additional backplate structure such as backplate 51 of FIG. 3 may not be required because planar portion 53 of metal frame 46M forms a backplate structure for button controller 22.

Figure 8:
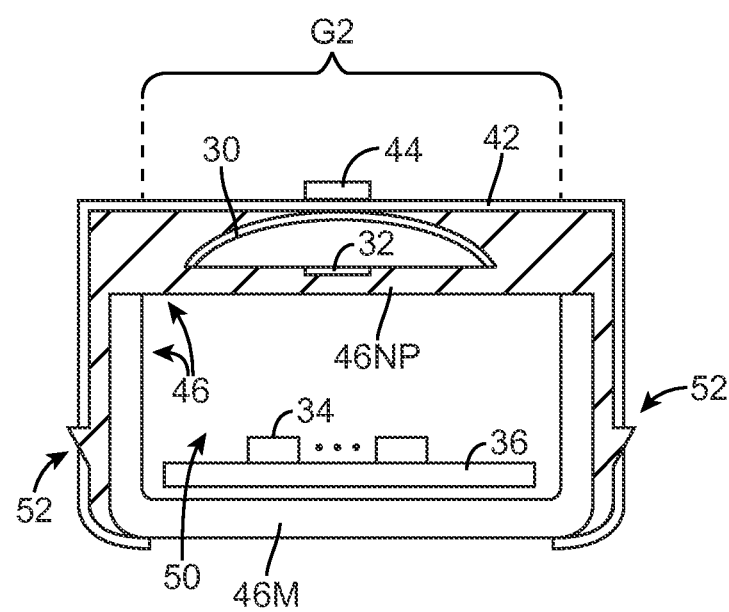
FIG. 8 is a cross-sectional side view of illustrative button controller structures in which a switch module housing structure is formed from a shot of non-conductive plastic having engagement features and a U-shaped metal frame in accordance with an embodiment.

The configuration of FIG. 7 in which metal structure 46M forms an exterior surface of housing structure 46 and includes engagement features 52 is merely illustrative. If desired, non-conductive housing structure 46NP may form an exterior surface for housing structure 46 and may include engagement features 52. This type of configuration is shown in FIG. 8. As shown in FIG. 8, housing structure 46 includes non-conductive plastic housing structure 46NP and U-shaped metal frame structure 46M. Non-conductive housing structure 46NP may be formed from a non-conductive plastic such as liquid crystal polymer, thermoplastic synthetic resin such as polyamide, glass-filled polymer, and/or other non-conductive plastic. Metal frame 46M may be formed from metal material such as sheet metal or other metal material. Non-conductive housing structure 46NP may be molded to include engagement features 52 for mounting switch module housing 46 and other switch module structures into a button controller housing for button controller 22.

Non-conductive housing structure 46NP may, for example, be formed using an insert-molding process in which non-conductive molten plastic 46NP is injected into a mold that includes electrical terminals 32. In other words, non-conductive plastic housing structure 46NP may be insert-molded around electrical terminals 32.

Following insert-molding non-conductive housing portion 46NP, non-conductive housing portion 46NP may be assembled with U-shaped metal frame 46M to form housing structure 46. As shown in FIG. 8, U-shaped metal frame 46M partially surrounds components 34 on printed circuit 36. The electromagnetic shield formed by metal frame 46M may include a gap such as gap G2. Flexible film 42 may be formed from a conductive material and may be formed over an upper surface of housing structure 46 to cover gap G2.

Flexible film 42 is formed on the surface of non-conductive housing structure 46NP and wraps around housing structure 46 to couple to metal frame 46M. Flexible film 42 and metal frame 46M together form an electromagnetic interference shield that completely surrounds components 34 on printed circuit 36. If desired, openings may be formed in flexible film 42 over engagement features 52 so that engagement features 52 are exposed and able to snap into place within the button controller housing for button controller 22.

Figure 9:
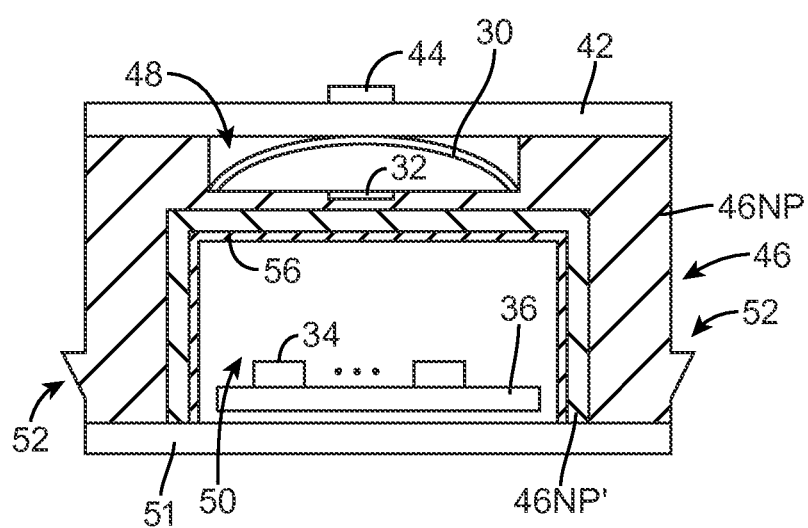
FIG. 9 is a cross-sectional side view of illustrative button controller structures in which a switch module housing structure is formed from a double-shot of non-conductive plastic and is lined with a conductive coating in accordance with an embodiment.

In another suitable embodiment, electromagnetic shielding structures in button controller 22 may include a conductive coating that is formed on a surface of housing structure 46 using a deposition tool. This type of configuration is shown in FIG. 9. As shown in FIG. 9, housing structure 46 includes non-conductive housing portions 46NP and 46NP'. Similar to the configuration described in connection with FIG. 3, housing structures 46 of FIG. 9 may be formed using a double-shot injection molding process. A first shot of non-conductive plastic 46NP may be injected around terminal structures 32 and may be used to electrically insulate terminal structures 32 from each other. A second shot of non-conductive plastic 46NP' may be overmolded onto non-conductive plastic housing structure 46NP and may be used to cover any exposed portions of terminal structures 32.

A conductive coating such as conductive coating 56 may be formed on the surface of housing structure 46. In the illustrative example of FIG. 9, conductive coating 56 is formed on an interior surface of housing structure 46 (e.g., on an interior surface of non-conductive housing portion 46NP') and forms a conductive lining that surrounds recess 50 in housing structure 46. This is, however, merely illustrative. If desired, conductive coating 56 may be formed on an exterior surface of housing structure 46 (e.g., on an exterior surface of non-conductive housing portion 46NP).

Conductive coating 56 may be deposited on the surface of housing structure 46 using evaporation, sputtering, spraying, dipping, other physical vapor deposition techniques, or other suitable techniques for applying conductive coatings to the surface of housing structure 46. Conductive coating 56 may be formed from copper, gold, aluminum, other metals, a combination of any two or more of these metals, etc.

As shown in FIG. 9, conductive coating 56 partially surrounds components 34 on printed circuit 36 and is coupled to conductive backplate 51. Conductive coating 56 and conductive backplate 51 together form an electromagnetic shield that completely surrounds components 34 on printed circuit 36. Because components 34 are adequately shielded from electromagnetic interference by conductive coating 56 and conductive backplate 51, flexible film 42 need not be conductive. Flexible film 42 may be formed from a non-conductive polymer such as polyethylene terephthalate (PET) or other suitable non-conductive flexible films. This is, however, merely illustrative. If desired, flexible film 42 may be formed from a conductive material.

Figure 10:
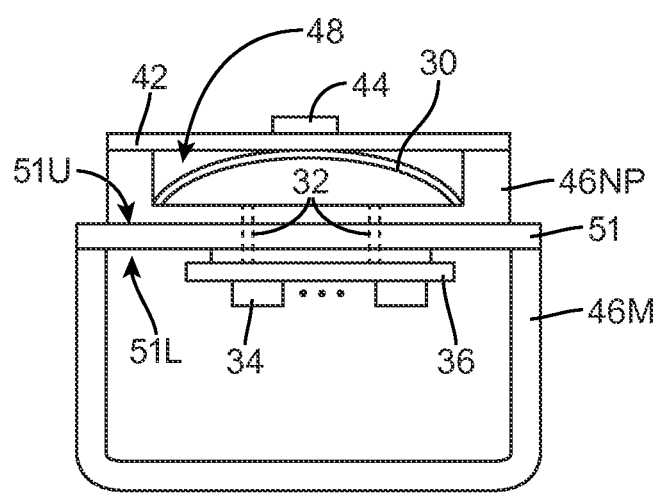
FIG. 10 is a cross-sectional side view of illustrative button controller structures in which a switch module is mounted to a conductive enclosure that surrounds an electrical component mounted to a printed circuit in accordance with an embodiment.

In another suitable embodiment, conductive backplate 51 is interposed between non-conductive plastic housing structure 46NP and metal frame structure 46M. This type of configuration is shown in FIG. 10. As shown in FIG. 10, dome switch member is mounted in recess 48 in non-conductive switch module housing structure 46NP. Non-conductive housing structure 46NP is mounted to a first surface such as upper surface 51U of conductive backplate 51. Printed circuit 36 is mounted to an opposing surface such as lower surface 51L of conductive backplate 51. Components 34 are mounted on printed circuit 36.

As shown in FIG. 10, electrical terminals 32 pass through backplate 51 to form an electrical connection with circuitry on printed circuit 36. An insulating material may be interposed between terminals 32 and conductive backplate 51 (e.g., rubber, foam, plastic, and/or other suitable dielectric material) and may be used to electrically insulate terminals 32 from backplate 51.

A metal frame structure such as U-shaped metal frame structure 46M is coupled to lower surface 51L of backplate 51 and partially surrounds components 34 on printed circuit 36. Metal frame 46M may, for example, be laser welded to lower surface 51L of backplate 51. Metal frame 46M and backplate 51 together form a conductive enclosure that completely surrounds components 34 and shields components 34 from electromagnetic interference. As shown in FIG. 10, printed circuit 36 is mounted to an interior surface of the conductive enclosure (e.g., to lower surface 51L of backplate 51), whereas switch module housing structures 46NP are mounted to an exterior surface of the conductive enclosure (e.g., to upper surface 51U of backplate 51).

A flexible film such as flexible film 42 is attached to the upper surface of switch module housing 46NP and is used to hold dome switch members 30 in place within recess 48. Flexible film 42 may also provide an environmental seal that prevents moisture and other contaminants from entering button controller 22. Because components 34 are completely shielded from electromagnetic interference using backplate 51 and metal frame 46M, flexible film 42 need not be conductive. Flexible film 42 may, for example, be formed from a non-conductive polymer such as polyethylene terephthalate (PET) or other suitable non-conductive flexible films. This is, however, merely illustrative. If desired, flexible film 42 may be formed from a conductive material.

Figure 11:
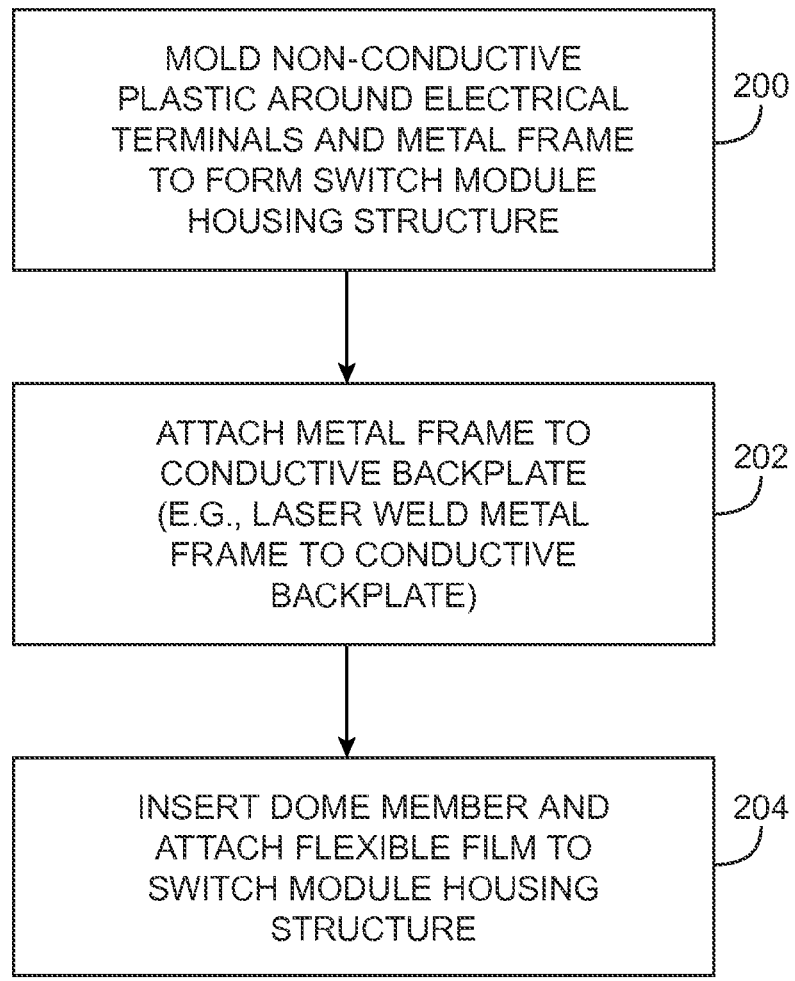
FIG. 11 is a flow chart of illustrative steps involved in assembling button controller structures of the type shown in FIGS. 5 and 6 in accordance with an embodiment.

FIG. 11 is a flow chart of illustrative steps involved in assembling a switch module of the type shown in FIGS. 5 and 6 for a button controller such as button controller 22. At step 202, an injection molding tool may be used to insert mold plastic for structures 46NP of FIGS. 5 and 6 over metal switch terminal structures 32 and metal frame structure 46M. The insert-molding tool may have a mold cavity configured to form molded non-conductive plastic structure 46NP of FIGS. 5 and 6. Electrical terminal structures 32 and metal frame structure 46M may be located within the mold cavity such that, when plastic structure 46NP hardens following insert-molding, plastic structure 46NP is mechanically bonded to electrical terminal structures 32 and metal frame 46M. Non-conductive plastic housing structure 46NP and metal frame 46M may together form switch module housing structure 46.

To form the switch module housing shown in FIG. 5, metal frame 46 includes engagement features 52 (e.g., metal structures that are laser welded to metal frame 46) and forms an exterior surface of switch module housing 46. To form the switch module housing shown in FIG. 6, non-conductive plastic structure 46NP is molded with engagement features 52 and forms an exterior surface of switch module housing 46.

At step 204, metal frame structure 46M may be attached to a conductive backplate such as conductive backplate 51. This may include, for example, laser welding metal frame 46M to conductive backplate 51. A printed circuit may be mounted on backplate 51 such that, when frame 46M is attached to backplate 51, components 34 are enclosed within recess 50 in switch module housing structure 46 and are completely surrounded by switch module housing structure 46 and backplate 51. Metal frame 46M and conductive backplate 51 may together form an electromagnetic interference shield that substantially surrounds components 34.

During the operations of step 204, switch module structures such as dome switch members 30 may be installed in recesses such as recesses 48 in housing 46 and film 42 may be used to cover dome switch members 30 and recesses 48, thereby forming a switch module for use in button controller 22. If desired, flexible film 42 may be a conductive film that provides electromagnetic interference shielding. Flexible film 42, metal frame 46M, and conductive backplate 51 may together form an electromagnetic interference shield that completely surrounds components 34.

Figure 12:
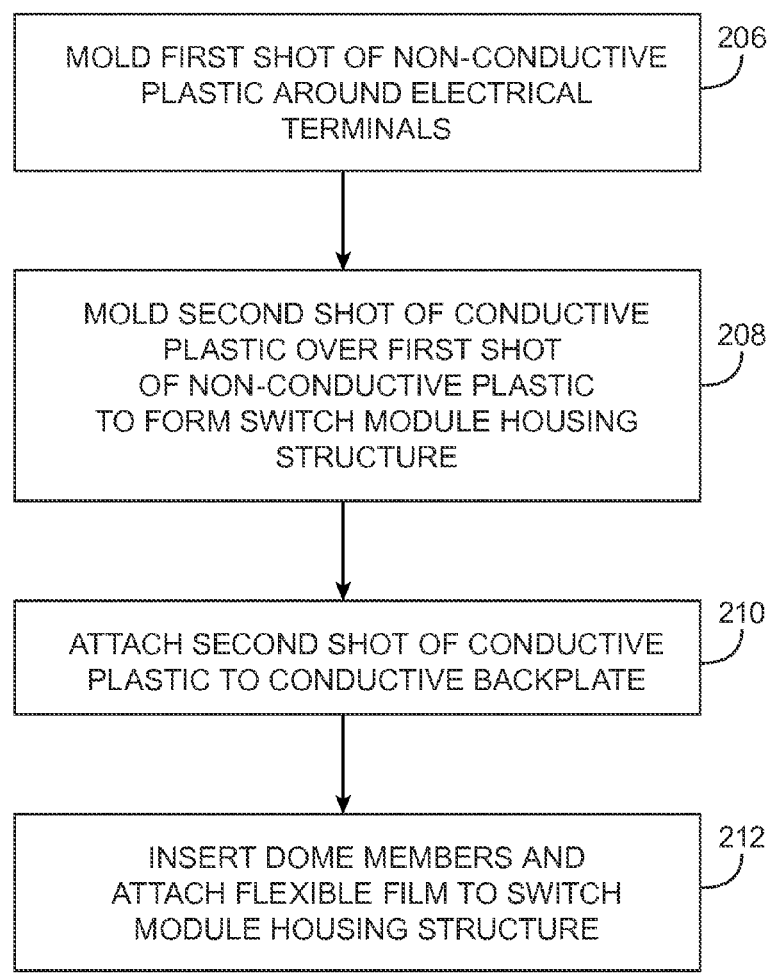
FIG. 12 is a flow chart of illustrative steps involved in assembling button controller structures of the type shown in FIG. 4 in accordance with an embodiment.

FIG. 12 is a flow chart of illustrative steps involved in assembling a switch module of the type shown in FIG. 4 for a button controller such as button controller 22. At step 206, an injection molding tool may be used to insert-mold a first shot of non-conductive plastic around electrical terminal structures 32. The injection molding tool may have a mold cavity configured to form plastic housing portion 46NP of FIG. 4. Features such as dome switch member recesses 48, component recesses 50, and engagement features 52 may, if desired, be incorporated into plastic structures 46NP.

At step 208, the injection molding tool may be used to insert mold a second shot of conductive plastic 46CP onto the first shot of non-conductive plastic 46NP. Conductive plastic 46CP may form a conductive lining that surrounds recesses 50 in plastic structure 46NP. If desired, conductive plastic 46CP may be formed on an exterior surface of non-conductive plastic 46NP. The embodiment in which conductive plastic 46CP forms a conductive lining on an interior surface of non-conductive plastic 46NP is merely illustrative.

Because conductive plastic 46CP is molded over non-conductive plastic 46NP, conductive plastic 46CP is mechanically bonded to non-conductive plastic 46NP. Conductive plastic structure 46CP and non-conductive plastic structure 46NP may together form switch module housing structure 46.

At step 210, conductive housing structure 46CP may be attached to a conductive backplate such as conductive backplate 51. A printed circuit may be mounted on backplate 51 such that, when conductive plastic 46CP is attached to backplate 51, components 34 are enclosed within (i.e., completely surrounded by) switch module housing structure 46 and backplate 51. Conductive plastic housing structure 46CP and conductive backplate 51 may together form an electromagnetic shield that completely surrounds components 34.

During the operations of step 212, switch module structures such as dome switch members 30 may be installed in recesses such as recesses 48 and film 42 may be used to cover dome switch members 30 and recesses 48, thereby forming a switch module for use in button controller 22. Flexible film 42 may be formed from a non-conductive polymer such as polyethylene terephthalate (PET) or other suitable non-conductive flexible films.

The foregoing is merely illustrative and various modifications can be made by those skilled in the art without departing from the scope and spirit of the described embodiments. The foregoing embodiments may be implemented individually or in any combination.

What is claimed is:

1. An apparatus, comprising:
    a switch module having metal switch terminals embedded in a plastic structure having at least one recess;
    an electrical component mounted on a printed circuit within the at least one recess;
    at least one dome switch formed from a dome switch member and portions of the switch terminals;
    a conductive film attached to the switch module over the dome switch member; and
    a conductive backplate that covers the recess, wherein the conductive film and the conductive backplate together form an electromagnetic interference shield that completely surrounds the electrical component.

2. The apparatus defined in claim 1 wherein the conductive film is coupled to and electrically grounded via the conductive backplate.

3. The apparatus defined in claim 1 wherein the switch module includes at least a first shot of plastic that has at least one additional recess configured to receive the dome switch member.

4. The apparatus defined in claim 3 further comprising at least a second shot of plastic overmolded onto the first shot of plastic.

5. The apparatus defined in claim 1 wherein the switch module comprises a metal frame and wherein the plastic structure is overmolded onto the metal frame.

6. The apparatus defined in claim 5 wherein the metal frame is welded to the conductive backplate.

7. The apparatus defined in claim 1 wherein the switch module comprises a U-shaped metal frame member and wherein the U-shaped metal frame member and the plastic structure form an enclosure that completely surrounds the electrical component.

8. An accessory button controller, comprising:
    a conductive enclosure having interior and exterior surfaces;
    a printed circuit mounted to the interior surface;
    an electrical component mounted to the printed circuit; and
    a switch module mounted to the exterior surface, wherein the switch module includes metal switch terminals that are electrically coupled to the printed circuit through the conductive enclosure and wherein the conductive enclosure shields the electrical component from electromagnetic interference.

9. The accessory button controller defined in claim 8 wherein the conductive enclosure comprises a planar sheet of metal and a U-shaped metal structure, wherein the planar sheet of metal is welded to the U-shaped metal structure.

10. The accessory button controller defined in claim 9 wherein the printed circuit is mounted to the planar sheet of metal.

11. The accessory button controller defined in claim 8 wherein the switch module comprises a plastic structure and wherein the switch terminals are embedded in the plastic structure.

12. The accessory button controller defined in claim 8 wherein the switch module comprises at least one dome switch formed from a dome switch member and portions of the switch terminals.

13. The accessory button controller defined in claim 12 further comprising a polymer film that covers the dome switch member.

14. A method, comprising:
- with an injection molding tool, insert molding a first shot of non-conductive plastic around metal switch terminals;
- overmolding a second shot of conductive plastic onto the first shot of non-conductive plastic to form a switch module housing structure having a recess;
- placing at least one electrical component mounted to a printed circuit within the recess; and
- attaching the switch module housing structure to a conductive backplate to enclose the at least one electrical component within the recess and to thereby shield the at least one electrical component from electromagnetic interference.

15. The method defined in claim 14 wherein overmolding the second shot of conductive plastic onto the first shot of non-conductive plastic comprises forming a conductive lining on the first shot of non-conductive plastic that surrounds the recess.

16. The method defined in claim 14 further comprising mounting a dome switch member in a cavity in the first shot of non-conductive plastic.

17. The method defined in claim 16 further comprising attaching a polymer film to the switch module housing structure to cover the dome switch member.

18. The method defined in claim 14 wherein the conductive plastic comprises a polymer with a conductive filler and wherein the conductive backplate and the second shot of conductive plastic together form an electromagnetic interference shield that completely surrounds the electrical component.

* * * * *